United States Patent
Fukawa et al.

[11] Patent Number: 5,936,807
[45] Date of Patent: Aug. 10, 1999

[54] MAGNETIC HEAD LOADING MECHANISM AND METHOD FOR TESTING A MAGNETIC DISK SURFACE THEREFOR

[75] Inventors: Masanori Fukawa, Hiratsuka; Tomomi Inoue, Odawara, both of Japan

[73] Assignee: Hitachi Electronics Engineering Co., Ltd., Tokyo, Japan

[21] Appl. No.: 09/008,431

[22] Filed: Jan. 16, 1998

[30] Foreign Application Priority Data

Jan. 21, 1997 [JP] Japan .................................... 9-022190
Jan. 21, 1997 [JP] Japan .................................... 9-022191

[51] Int. Cl.$^6$ ........................... G11B 5/455; G01R 33/12
[52] U.S. Cl. ......................... 360/105; 360/104; 360/128; 324/212
[58] Field of Search .................................. 360/104–106, 360/128, 137; 324/210, 212

[56] References Cited

U.S. PATENT DOCUMENTS

| 5,410,439 | 4/1995 | Egbert et al. ............................... 360/75 |
| 5,527,110 | 6/1996 | Abraham et al. ........................... 360/75 |
| 5,589,771 | 12/1996 | Chur ..................................... 360/130.3 |
| 5,666,237 | 9/1997 | Lewis ..................................... 360/72.1 |
| 5,758,406 | 6/1998 | Hunsaker et al. .................... 29/603.06 |
| 5,825,180 | 10/1998 | Guzik ...................................... 324/212 |

FOREIGN PATENT DOCUMENTS 6-302120  10/1994  Japan .

*Primary Examiner*—Jefferson Evans
*Attorney, Agent, or Firm*—Antonelli, Terry, Stout & Kraus, LLP

[57] ABSTRACT

A magnetic head loading mechanism for loading two magnetic heads 2(A) and 2(B), each of which is attached at a tip of respective one of supporting arms 3 and 3, onto a surface of a magnetic disc 1 to be tested being rotated with high rotation speed, comprising: two adopters 71(A) and 71(B), on which are fixed the supporting arms 3 and 3 in a detachable manner; two head position adjusting mechanisms 74(A) and 74(B) for rotating the adopters 71(A) and 71(B) so as to bring the supporting arms 3 and 3 into either an escaping condition in which they are far away from the surfaces of the magnetic disc 1 each by a rotation angle of 90°, or into an approaching condition in which they are near to the surface of the magnetic disc 1 to be tested; and a mounting mechanism including a common elevating block 731 formed with inclined surfaces, and rollers 714 and 714, each being provided for the adopters 71(A) and 71(B) and being in contact with the inclined surfaces of the elevating block in the approaching condition, thereby moving the magnetic heads 2(A) and 2(B) at the tip of the supporting arms 3 and 3 onto both surfaces of the magnetic disc 1 by a small amount of rotation in the angle thereof, respectively.

8 Claims, 4 Drawing Sheets

WAITING CONDITION

APPROACHING CONDITION

FLOATING CONDITION

MAGNETIC HEAD LOADING MECHANISM AND METHOD FOR TESTING A MAGNETIC DISK SURFACE THEREFOR

BACKGROUND OF THE INVENTION

1. Field of the Invention

The present invention relates to a magnetic head loading mechanism of rotary type for loading/unloading a magnetic head with respect to a magnetic disc, and in particular is suitable for use in a testing equipment, and relates to a loading method for loading the magnetic head onto a surface of the magnetic disc with using an arrangement such as the rotary type magnetic head loading mechanism.

2. Description of Related Art

A hard disc drive for constituting a so-called disc drive apparatus, after being produced, is inspected or checked with a testing equipment one by one for defects on the magnetic medium thereof. In the inspection or checking with the testing equipment, a magnetic head is loaded onto a surface of the magnetic disc to be checked with a so-called loading mechanism so as to try write-in and read-out of test data into it and from it. Among various disc drive apparatuses, there are mainly two prevailing types for a loading mechanism thereof, i.e. a linear type loading mechanism and a in-line type loading mechanism. In recent years, most of the disc drive apparatuses apply the in-line type loading mechanism, and therefore, as the loading mechanism for the testing equipment thereof also mainly uses the in-line type loading mechanism in the same manner.

FIG. 4 shows an example of the loading mechanism of such the in-line type in accordance with the prior art mentioned in the above.

The magnetic heads 2(A) and 2(B) for both surfaces (a front surface and for a reverse surface) of the magnetic disc 1 are fixed at top edges or tips of respective supporting arms 3 and 3. The loading operation is same for the both magnetic heads 2(A) and 2(B), and therefore, it will be explained hereinafter in common for both of them. The supporting arm 3 is fixed onto a fixing member 41 of a rotating mechanism 4, at a rear edge portion thereof, in a detachable manner; Therefore, it rotates in a direction indicated by an arrow R from a position for turning away or escaping as shown by a dotted line, by means of a rotation of an electric motor 42, and thereby the magnetic head 2 moves onto and off of the surface of the magnetic disc 2. On the fixing member 41, there is provided a loading arm 5, a pin 51 of which pushes the supporting arm 3 at the bottom surface thereof upwards with pressure, however, the magnetic head 2 falls down to be loaded onto a first track $T_{R1}$ of the magnetic disc 1 when the pin 51 goes down, thereby starting the inspection or checking thereof. After finishing the checking, the magnetic head 2 shifts to a next track $T_{R2}$ to inspect it again, and this is repeated until when it reaches to the final track $T_{Rn}$ of the magnetic disc 1. After completion of the inspection, the pin 51 goes up for the purpose of unloading of the magnetic head 2 therefrom.

In the disc drive apparatuses of the recent years, both the magnetic disc and the magnetic head 2 are miniaturized in sizes thereof, in particular, distances between plural pieces of the discs come to be very narrow with respect to one another, and therefore it is impossible to provide the pin 51 of the above-mentioned loading arm 5 in a space defined between the supporting arm 3 and the surface of the magnetic disc 1. On the contrary, for dissolving such the drawback as mentioned in the above, a loading mechanism of a rotary type has been proposed, such being applicable to both the disc drive apparatus and the testing equipment, and it has been already known by Japanese Patent Laying-Open No. Hei 4-295678 (1992) having a title of "Head Loading Mechanism". The head loading mechanism disclosed therein will be explained hereinafter by referring to an attached FIG. 5.

In this FIG. 5, the loading mechanism 6 is provided with a rotating plate 61 which rotates with respect to the fixing element 41 of the rotating mechanism 4 shown in FIG. 4 mentioned above, and a rotating shaft 62 thereof is connected with the fixing element 41 through a connecting arm 63. Further, a driving arm 64, corresponding to the loading arm 5 mentioned in the above, is provided between the fixing element 41 and the rotating plate 61. When the top edge or the tip of the driving arm 64 goes up, the rotating plate 61 rotates around a center of the rotating shaft 62 so as to descent the supporting arm 3 downwards, thereby loading the magnetic head 2 on the magnetic disc.

SUMMARY OF THE INVENTION

However, the loading mechanism of the in-line type is very complex in construction and the number of parts thereof comes to be large, and therefore, it is rather difficult to keep good maintenance of it. Further, since the links are used in that mechanism, there is a drawback that dust or particles are easily caused by friction of them and attach on the surface of the magnetic disc, and therefore lubrication oil must be supplied frequently.

On the other hand, the loading mechanism of the rotary type which is disclosed in the above-mentioned FIG. 5 is preferable on the principal thereof, in particular for use in the testing equipment. However, in the testing equipment, the magnetic disc to be tested must be exchanged with an automatic transfer mechanism for every inspection thereof, and maintenance of the loading mechanism as well as replacement of the magnetic head 3 are also necessary frequently. Therefore, an improved magnetic head loading mechanism is desired with which the maintenance of the loading mechanism and the replacement of the magnetic head 3 can be done smoothly and with ease.

An object in accordance with the present invention is for dissolving the drawbacks in the conventional art mentioned in the above, and to provide a magnetic head loading mechanism of a rotary type, with which the magnetic discs can be exchanged smoothly and easily, as well as one where maintenance of the mechanisms and the replacement of the magnetic head can be performed easily.

Furthermore, another object of the present invention is to provide a loading method for loading the magnetic head onto a surface of the magnetic disc without contacting a part of a bottom surface thereof on the surface of the magnetic disc, i.e.; during the loading operation with a loading mechanism of the rotary type as mentioned in the above.

For accomplishing the above-mentioned object, first of all, in accordance with the present invention, there is provided a magnetic head loading mechanism for loading a magnetic head onto a surface of a magnetic disc to be tested being rotated with high rotation speed, wherein a first magnetic head for a surface of said magnetic disc to be tested which is attached at a tip of a first supporting arm, comprising:

a first adopter means, on a part of which is fixed said first supporting arm in a detachable manner;

a first rotating mechanism for rotating said first adopter means so as to bring said first magnetic head attached at the tip of said second supporting arm into either one of an escaping condition in which it is far away from the surface of said magnetic disc to be tested and an approaching condition in which it is near to the surface of said magnetic disc to be tested; and a first mounting mechanism for moving and mounting said first magnetic head at the tip of said first supporting arm onto the surface of said magnetic disc by rotating said first adopter means by a small amount of rotation angle thereof.

Further, in accordance with the present invention, there is provided magnetic head loading mechanism for loading a magnetic head onto a surface of said magnetic disc to be tested as described in the above, wherein there is further provided a second magnetic head for a reverse surface of said magnetic disc to be tested which is attached at a tip of a second supporting arm, and further comprising:

a second adopter means, on a part of which is fixed said second supporting arm in a detachable manner;

a second rotating mechanism for rotating said second adopter means so as to bring said second magnetic head attached at the tip of said second supporting arm into either one of an escaping condition in which it is far away from the reverse surface of said magnetic disc to be tested, and an approaching position in which it is near to the reverse surface of said magnetic disc to be tested; and a second mounting mechanism for moving and mounting said second magnetic head at the tip of said second supporting arm onto the reverse surface of said magnetic disc by rotating said second adopter means by a small amount of rotation angle thereof.

Furthermore, in accordance with the present invention, there is provided a magnetic head loading mechanism for loading a magnetic head as described in the above, wherein said first rotating mechanism brings said first supporting arm into the escaping condition by turning said first supporting member away from the surface of said magnetic disc by an amount of approximately a right angle.

Furthermore, in accordance with the present invention, there is provided a magnetic head loading mechanism for loading a magnetic head as described in the above, wherein said second rotating mechanism brings said second supporting arm into the escaping condition by turning said second supporting arm away from the reverse surface of said magnetic disc by an amount of approximately a right angle.

Moreover, in accordance with the present invention, there is provided a magnetic head loading mechanism for loading a magnetic head as described in the above, wherein said first and second mounting mechanism further comprise a common elevating block, on both side surfaces of which are formed with inclined surfaces, and rollers, each being provided for said first and second adopters and being in contact with the inclined surfaces of said elevating block in the approaching condition, thereby moving the first and second magnetic heads at the tips of said first and second mounting arms onto the both surfaces of said magnetic disc by the small amount of rotation angle thereof, respectively.

Furthermore, in accordance with the present invention, there is provided a magnetic head loading mechanism for loading a magnetic head as described in the above, wherein said first and second rotating mechanisms and said first and second loading mechanisms, including said rollers, are arranged in symmetry with respect to said elevating block.

And, for accomplishing the another object, in accordance with the present invention, there is provided a magnetic head loading mechanism for loading a magnetic head as described in the above, wherein said first adopter means further comprises a head holding member for holding the first magnetic head from a bottom side surface of said first supporting arm thereof at a predetermined position with respect to the surface of said magnetic disc.

Further, for accomplishing the another object, in accordance with the present invention, there is also provided a loading method for loading a magnetic head onto a surface of a magnetic disc to be tested being rotated with high speed, by using a magnetic head loading mechanism as described in the above, comprising following steps of:

holding said first magnetic head attached at a tip of said first supporting arm which is fixed on said first adopter means, by using said holding member, at a predetermined position with respect to the surface of said magnetic disc, from a bottom side surface of said supporting arm;

approaching said first magnetic head onto the surface of said magnetic disc by rotating said first adopter means; and further approaching said first magnetic head to the surface of said magnetic disc by rotating said first adopter means by a small amount of rotation angle thereof, thereby mounting said first magnetic head upon the surface of said rotating magnetic disc, by floating said first magnetic head and bringing said first supporting arm thereof free from said holding member.

DESCRIPTION OF THE PREFERRED EMBODIMENTS

Hereinafter, detailed explanation of the embodiments according to the present invention will be given by referring to attached drawings.

Figure 1:
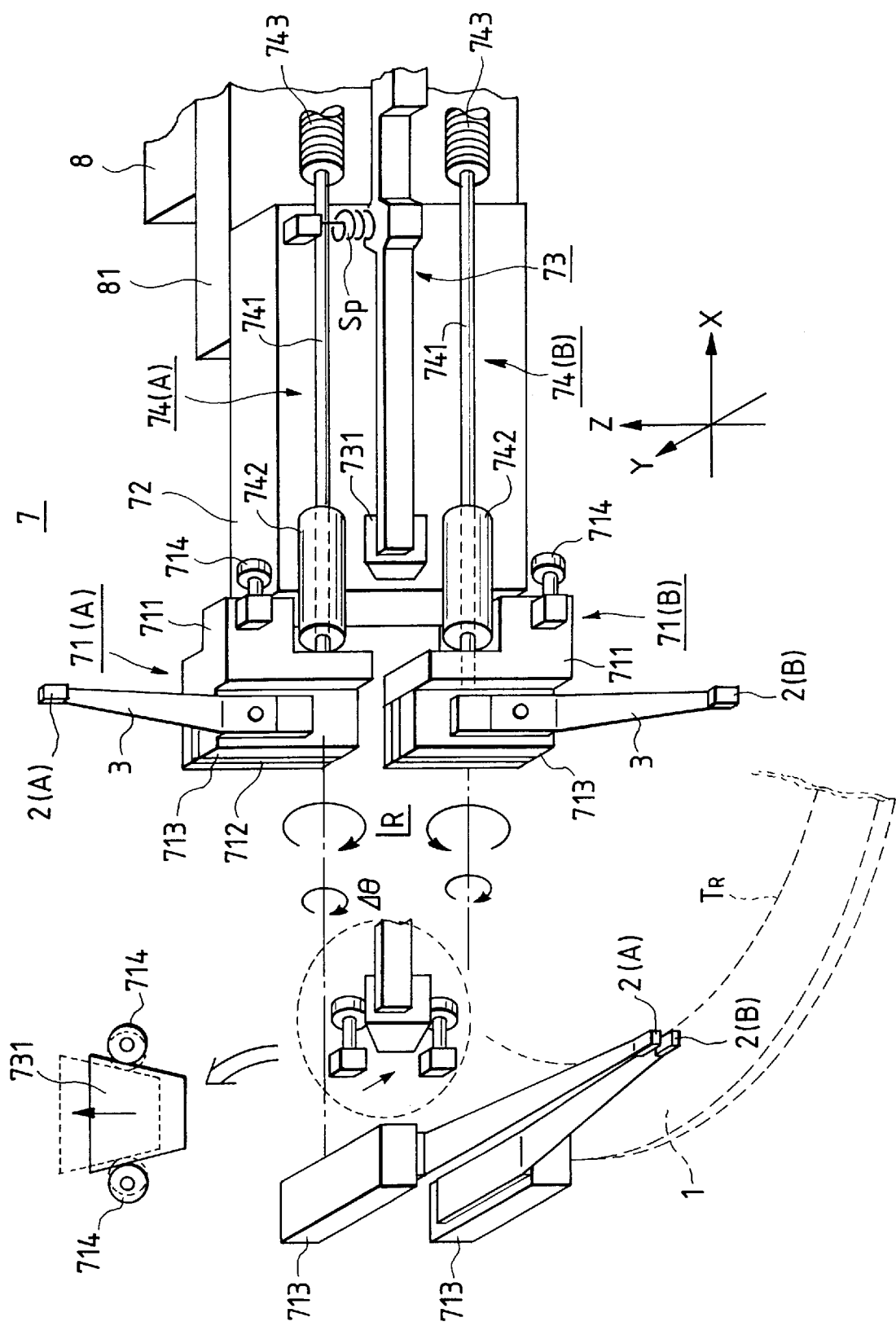
FIG. 1 is an explanatory diagram for showing internal construction of a magnetic head loading mechanism in accordance with an embodiment of the present invention.

In FIG. 1 is shown an embodiment of a magnetic head loading mechanism 7, in accordance with the present invention, wherein, an escaping condition for the magnetic heads is shown in the left-hand side portion and another condition of approaching for them in the right-hand side portion thereof. As is apparent from the drawing, basically, a pair of supporting arms 3 and 3, for each of magnetic heads 2(A) and 2(B) with respect to a magnetic disc 1 to be tested, are fixed in a detachable manner onto two adopters 71(A) and 71(B), respectively. When both adopters 71(A) and 71(B) which are mounted on a framework 72 for mounting the adopters are in the condition of coming close or approaching to each other, as is shown in the left-hand side of the drawing, then both supporting arms 3 and 3 are aligned in parallel to each other in the same direction, and each of magnetic heads 2(A) and 2(B) approaches to the respective surface of the magnetic disc 1 to be tested, respectively. In this condition of coming close or approaching, when a pushing rod 73 which is pivotally supported on the framework 72 for mounting the adopters is pushed down at a rear end portion thereof, in opposition to the suppressing force from a spring Sp, an elevating block 731 attached at the tip of it rises up (in a direction shown by an arrow in the drawing). As a result of this, a distance between two rollers 714 and 714 which are in contact with inclined surfaces on both sides of the elevating block 731 is decreased down, and the both adopters 71(A) and 71(B) which are already in the condition of coming close or approaching are further rotated by a very small amount of angle, so that the magnetic heads 2(A) and 2(B) are loaded onto the respective one of the both surfaces of the magnetic disc 1 which is supported on and rotated with a high rotation speed by such as a disc drive assembly not shown in the drawing.

On the other hand, as shown in the right-hand side of the drawing, when the both adopters 71(A) and 71(B) are rotated by a right angle (90°) away from the above-mentioned approaching condition, respectively, then it is in the condition of escaping. In this condition of escaping, the both supporting arms 3 and 3 are also aligned but in an opposite direction to each other, and the both magnetic heads 2(A) and 2(B) are turned away from the magnetic disc 1, thereby the magnetic disc 1 can be exchanged smoothly, and maintenance of the mechanism as well as the replacement of the magnetic heads 2(A) and 2(B) can be carried out with ease.

Explaining in more detail on the embodiment mentioned briefly by referring to FIG. 1 in the above, the loading mechanism 7 is constructed with those two adopters 71(A) and 71(B), the framework 72 for mounting the adopters and the pushing rod 73, but each only one, and two head position adjusting mechanisms 74(A) and 74(B). The framework 72 for mounting the adopters is fixed at an appropriate position of a carriage mechanism 8 with a mounting element 81.

Each of those two adopters 71(A) and 71(B) is constructed with a mounting block 711, a head fixing element 713 being mounted on it through an adjusting spacer 712 in rotatable manner by only a very small amount of angle, and a roller 714, respectively. The adjusting spacer 712 is for adjusting in the height of the magnetic head 2 with respect to the magnetic disc 1 which might have various thickness for various kinds. The both mounting blocks 711 and 711 are mounted, being able to rotate by a right angle (90°), on the framework 72 for mounting the adopters. On the head fixing element 713 of the adopter 71(A) is fixed the magnetic head 2(A) for a front or main side surface of the magnetic disc 1, and on the head fixing element 713 of the adopter 71(B) is fixed the magnetic head 2(B) for a reverse side surface thereof, respectively, in a detachable manner. In the condition of escaping, the both supporting arms 3 and 3 are vertically aligned on a line and in opposite direction to each other, as shown in the drawing, to turn them away from the magnetic disc 1, thereby the magnetic disc 1 can be exchanged smoothly, and the maintenance and repair of the respective mechanisms as well as the replacement of the magnetic heads 2 are able to be carried out with ease.

The pushing rod 73 is pivotally supported on the framework 72 for mounting the adopters 71(A) and 71(B) at the position as shown in the drawing, and it is attached at the tip thereof with the elevating block 731, both side surfaces of which are formed being inclined or tapered. The pushing rod 73 is biased with a spring Sp, and the elevating block 731 descends under the condition of escaping.

Each of mechanisms 74(A) and 74(B) for adjusting positions of the both magnetic heads 2(A) and 2(B) (i.e., for mounting) is constructed with a shaft 741, a bearing 742 of a cylinder type, and a knob 743, respectively. Both shafts 741 and 741 are connected with both head fixing elements 713 and 713, respectively, therefore they can rotate around those rotating shafts 741 and 741 by a very small angle. Further, the rotations of both adopters 71(A) and 71(B) by a right angle (90°) are made also around those rotating shafts 741 and 741, respectively, but manually by hand works in the present embodiment. Furthermore, both magnetic heads 2(A) and 2(B) can be adjusted at their positions in front and rear by the operation of the knobs 743 and 743, respectively.

During the loading operation of the both magnetic heads 2(A) and 2(B), both adopters 71(A) and 71(B) which are in the escaping condition as mentioned in the above are rotated manually by hand in the directions opposing to each other, respectively, by the angle of rectangular (90°), and thereby they are changed and brought into the approaching condition as is shown in the left-hand side of the drawing. In this approaching condition, both supporting arms 3 and 3 are horizontally aligned in parallel to each other in the same direction, and therefore both magnetic heads 2(A) and 2(B) are approaching to both surfaces of the magnetic disc 1, respectively. Further, both rollers 714 and 714 are contacting on the inclined planes on both side surfaces of the elevating block 731 and are able to be loaded.

Here, when the pushing rod 73 is pushed down at the rear end thereof by means of, for example, an automatic control mechanism not shown in the drawing, then the elevating block 731 rises up to the position indicated by a dotted line in the drawing, and the distance between those rollers 714 and 714 are reduced, thereby both head fixing elements 713 and 713 are rotated by a very small amount of angle ($\Delta\theta$) so as to load both magnetic heads 2(A) and 2(B) onto both surfaces of the magnetic disc 1, respectively.

Next, a loading method for loading the magnetic head onto the surface of the magnetic disc 1, without touching a portion of the bottom face thereof, will be explained in accordance with the present invention.

Figure 2A:
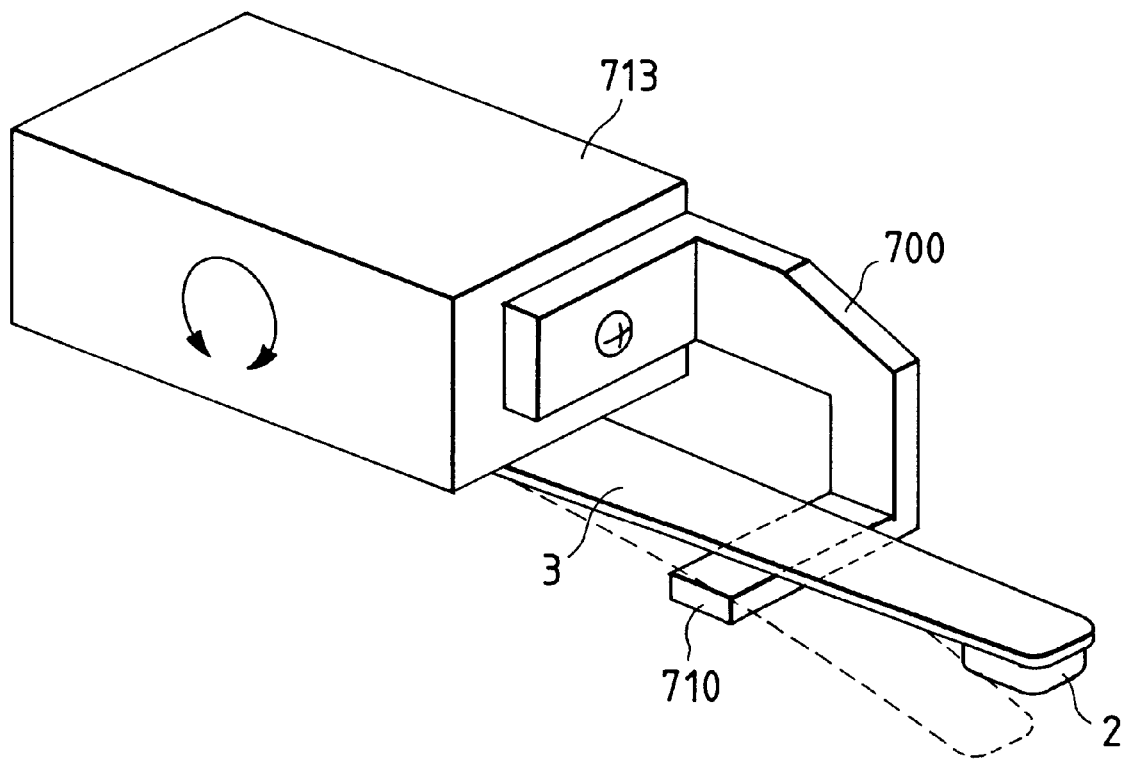
FIGS. 2(a) and (b) are perspective views for showing head holding members, each of which is fixed on a part of an adopter in the magnetic head loading mechanism mentioned in the above.
Figure 2B:
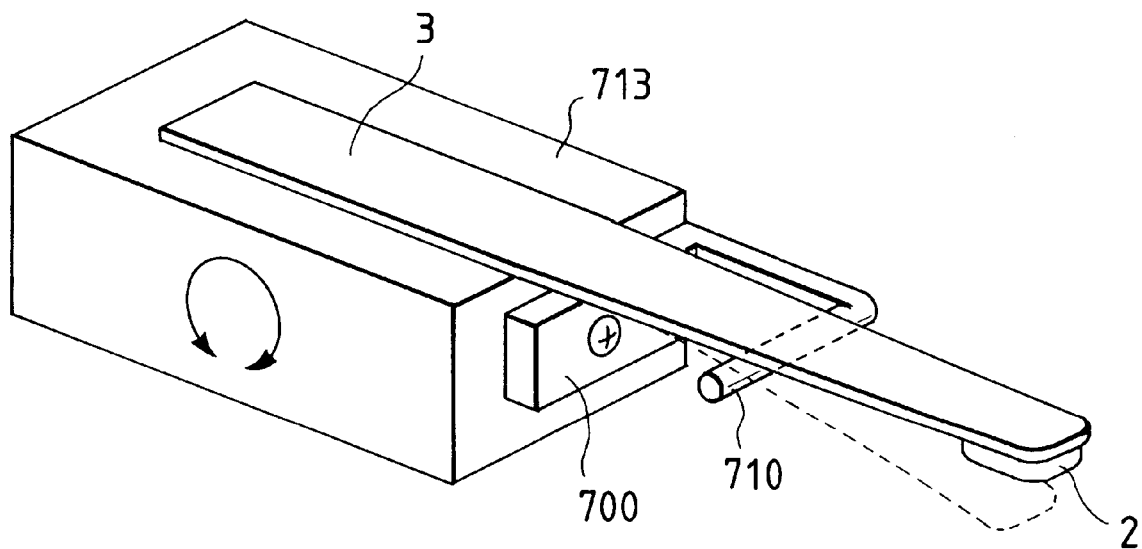

However, in this embodiment, though it is not shown in FIG. 1 mentioned in the above, a head holding member 700, as is shown in FIGS. 2(A) and (B), with which is formed a head holding portion 710 (of a plate-like shape in FIG. 2(A), and a rod-like shape in FIG. 2(B)) as an unit together, is attached at a part of the head fixing element 713 which is attached on the mounting block 711 on the adopter 71. Further, as apparent from FIGS. 2(A) and (B), the supporting arm 3 at the tip of which is attached with the magnetic head 2 is mounted or fixed either on the upper surface or the lower surface of the head fixing member 713 (in the embodiment shown in FIG. 1, it is attached on the lower surface thereof), by a fixing means not shown in the drawing. The head holding member 700 is holding or supporting at a part of the supporting arm 3 of various kinds which is attached on the rotating head fixing element 713, from the lower surface thereof, thereby adjusting the magnetic head 2 which is attached at the tip of the supporting arm 3 at a predetermined position (in particular, in height thereof).

Namely, in the loading method in accordance with the present invention, the supporting arm 3 is supported or held at the lower surface thereof from the head holding portion 710 of the head holding member 700 fixed onto the rotating head fixing element 713. The angle of it is so adjusted that the bottom surface of the magnetic head 2 is in parallel to the surface of the magnetic disc 1 with each other when it approaches to the surface of the magnetic disc 1 by the rotation thereof in the loading operation (here, the supporting arm 3 before being adjusted is shown by a broken line in the drawings). Then, the bottom surface of the magnetic head 2 is approached uniformly as a whole to the surface of the magnetic disc 1 by rotating the supporting arm 3 which is adjusted at the angle thereof. Following to this, when the head fixing element 713 is rotated by a very small amount of angle, the supporting arm 3 is separated from the head holding portion 710 and is in a condition of being free therefrom. Thereby, the magnetic head 2 is loaded on the magnetic disc 1, floating on an air flow on the surface of the magnetic disc 1, at the height balancing between suppressing force from the supporting arm 3 due to the rotation of the head fixing element 713 and floating force due to the air flow on the surface of the magnetic disc 1. Therefore, the magnetic head 2 can be escaped from contacting on the surface of the magnetic disc 1, in particular, at a portion of the bottom surface thereof.

In FIG. 3 showing the construction of the loading mechanism for performing the loading method in accordance with the present invention, in various conditions thereof, a reference numeral 62 indicates a rotating mechanism, including the knob 43 mentioned in the above, by which the head fixing member 713 attached on the mounting block 711 of the above-mentioned adopter 71 is rotated around a rotating shaft 61. Further, in the embodiment shown in this drawing, the supporting arm 3 at the tip of which is attached the magnetic head 2 is fixed on the upper side surface of the head fixing member 713, and on the end face thereof is attached the head holding member 700 which forms the head holding portion 710 as an unit therewith. Thereby, the supporting arm 3 is supported at the lower surface thereof from the head holding portion 710 so as to be held horizontal in the position thereof.

Next, details of the loading method, in accordance with the present invention, in particular the operation of the magnetic head in the method, will be explained with referring to FIGS. 3(A) through (C).

Figure 3A:
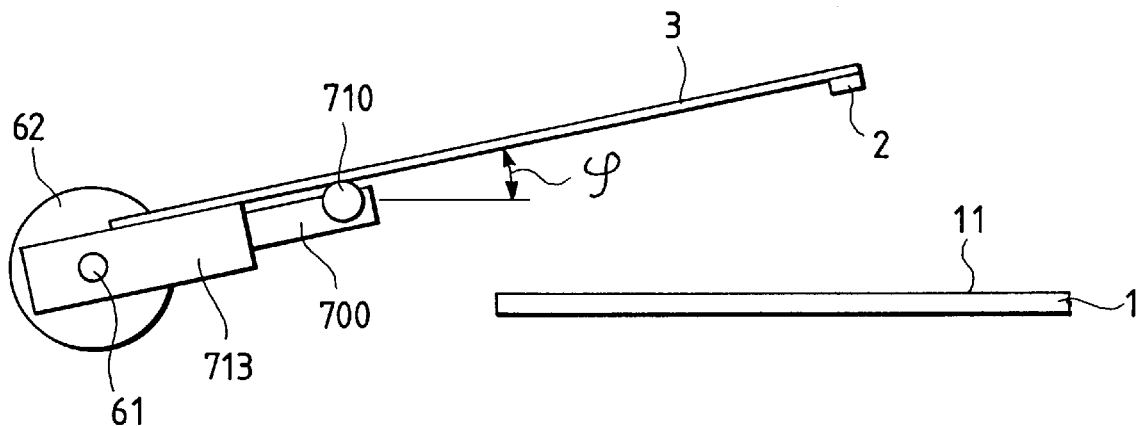
FIGS. 3(a) to (c) are explanatory diagrams for showing various conditions in a loading method which is processed by the magnetic head loading mechanism in accordance with an embodiment of the present invention.
Figure 3B:
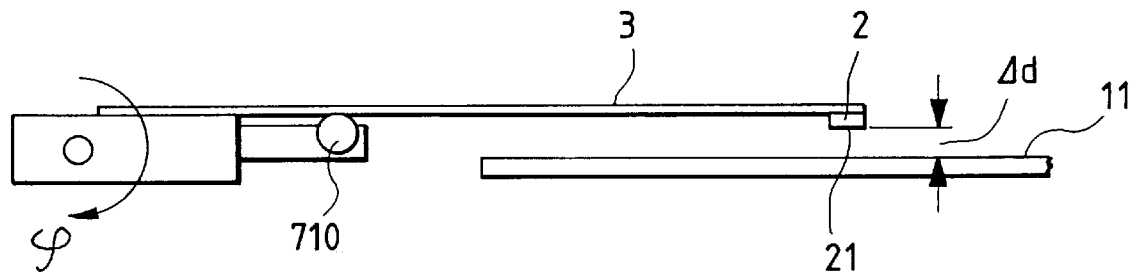
Figure 3C:
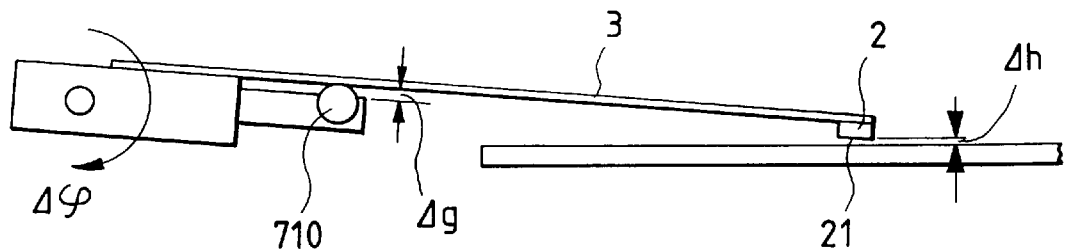
Figure 4:
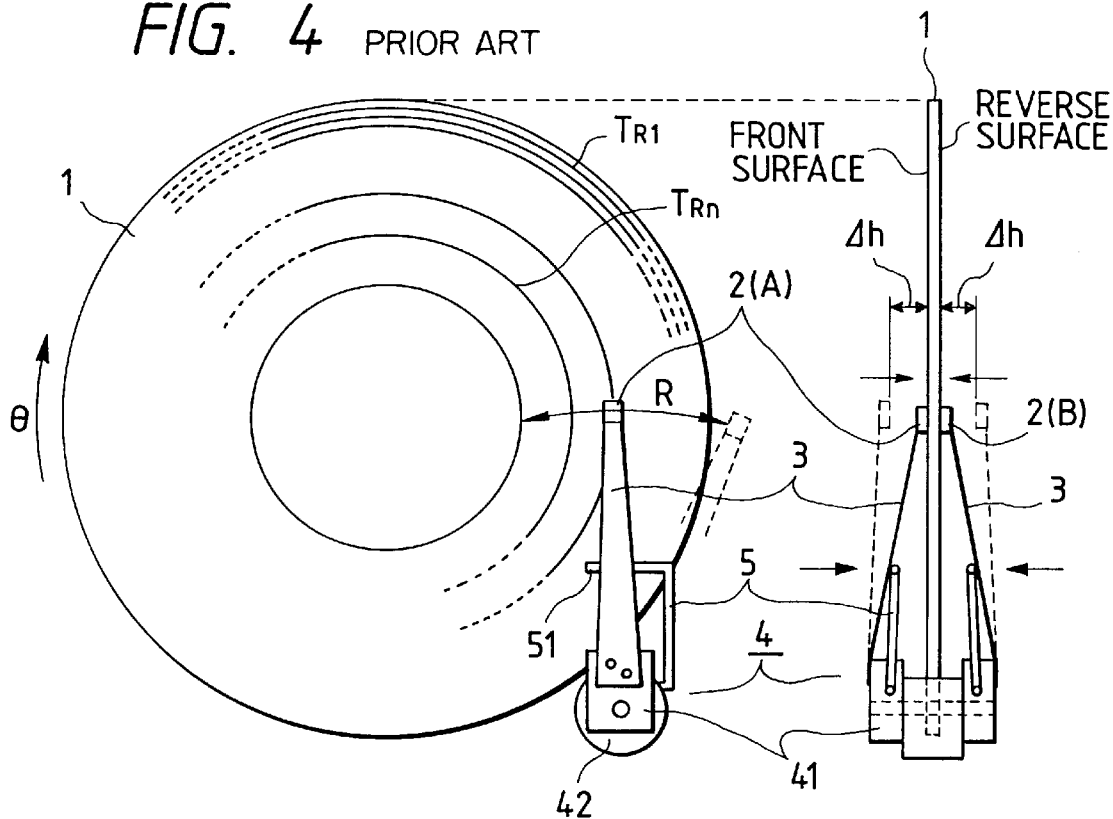
FIG. 4 is a top view for showing construction of a conventional magnetic head loading mechanism.
Figure 5:
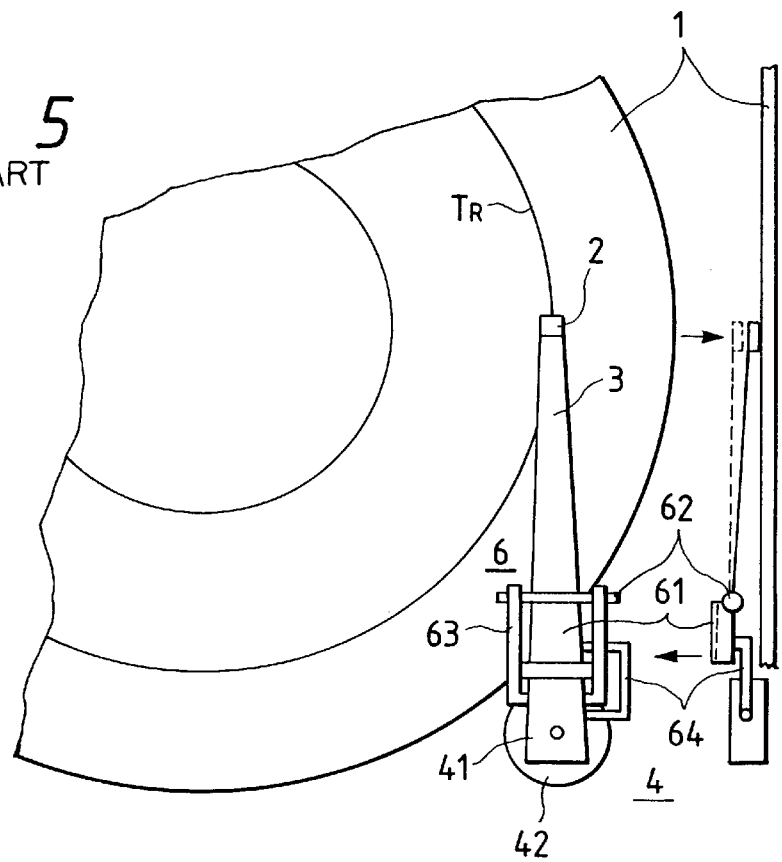
FIG. 5 is also a top view for showing construction of an another conventional magnetic head loading mechanism.

FIG. 3(A) shows a waiting condition of the magnetic head 2. In this condition, the supporting arm 3 and the bottom surface 21 of the magnetic head 2 are adjusted in such a manner that they define an angle φ with respect to the surface 11 of the magnetic disc 1. Then, when the head fixing element 713 is rotated in the direction shown by an arrow in the drawing by the angle φ by means of the rotating mechanism 62, as is shown in FIG. 3(B), the supporting arm 3 rotates downwards to be in the approaching condition in which the magnetic head 2 is separated from the surface 11 of the magnetic disc 1 only by a very small amount of distance Δd. In this condition, the supporting arm 3 and the bottom surface 21 of the magnetic head 2 are in parallel to the surface 11 of the magnetic disc 1. Thereafter, when the head fixing element 713 is rotated further by a very small amount of angle Δφ by means of the rotating mechanism 62, as is shown in FIG. 3(C), the floating force due to the air flow generated by the high speed rotation of the magnetic disc 1 acts on the magnetic head 2. Thereby, the supporting arm 3 is in the condition that it is free or separating from the head holding portion 710 by a very small amount of gap Δ g, and that it is suppressed downwards by the force including a rotating of the rotating mechanism 62. Then, the magnetic head 2 is floated at a normal height Δh balancing between the suppressing force and the floating force due to the air flow, and the loading operation is completed. Apparent from the above, the magnetic head 2 is protected from being contacted with the surface 11 of the magnetic disc 1 at a part of the bottom surface 21 thereof. Moreover, during an unloading operation where the magnetic head 2 is separated or removed away from the surface 11 of the magnetic disc 1, though the rotating mechanism 62 rotates in the direction opposing to that mentioned in the above, since the bottom surface 21 of the magnetic head 2 and the bottom surface 11 of the magnetic disc 1 are in parallel to each other in before and after the separating operation, it is also protected from such the drawback that the bottom surface 21 of the magnetic head 2 touches the surface 11 of the magnetic disc 1 partially.

As is fully explained in the above, the magnetic head loading mechanism in accordance with the present invention, because of application of the mechanism of rotary type, is relatively small in the number of parts as well as simple in the construction thereof, and in particular, under the condition of escaping of the mechanism, i.e., the supporting arms turning away from the magnetic disc by the right angle, the replacement of the magnetic heads and the maintenance as well as the exchange of the magnetic disc can be performed very smoothly and with ease, therefore being very suitable for use in the testing equipment for the magnetic disc. Furthermore, with the loading method for such the magnetic head loading mechanism of rotary type in accordance with the present invention, damage or defect on both of the magnetic head and the magnetic disc, due to contact of a part of the bottom surface of the magnetic head on the magnetic disc surface, can be inhibited during the loading and/or unloading operation, thereby the test equipment of the magnetic disc can be kept in good working order with certainty and effective in the operation.

What is claimed is:

1. A magnetic head loading mechanism for loading a magnetic head onto a surface of a magnetic disc to be tested being rotated with high rotation speed, wherein a first magnetic head for a surface of said magnetic disc to be tested is attached at a tip of a first supporting arm, comprising:

a first adopter means, on a part of which is fixed said first supporting arm in a detachable manner;

a first rotating mechanism for rotating said first adopter means so as to bring said first magnetic head attached at the tip of said second supporting arm into either one of an escaping condition in which it is far away from the surface of said magnetic disc to be tested and an approaching condition in which it is near to the surface of said magnetic disc to be tested; and a first mounting mechanism for moving and mounting said first magnetic head at the tip of said first supporting arm onto the surface of said magnetic disc by rotating said first adopter means by a small amount of rotation angle thereof.

2. A magnetic head loading mechanism for loading a magnetic head onto a surface of said magnetic disc to be tested as defined in claim 1, wherein there is further provided a second magnetic head for a reverse surface of said magnetic disc to be tested which is attached at a tip of a second supporting arm, and further comprising:

a second adopter means, on a part of which is fixed said second supporting arm in a detachable manner;

a second rotating mechanism for rotating said second adopter means so as to bring said second magnetic head attached at the tip of said second supporting arm into either one of an escaping condition in which it is far away from the reverse surface of said magnetic disc to be tested and an approaching position in which it is near to the reverse surface of said magnetic disc to be tested; and a second mounting mechanism for moving and mounting said second magnetic head at the tip of said second supporting arm onto the reverse surface of said magnetic disc by rotating said second adopter means by a small amount of rotation angle thereof.

3. A magnetic head loading mechanism for loading a magnetic head as defined in claim 2, wherein said second rotating mechanism brings said second supporting arm into the escaping condition by turning said second supporting arm away from the reverse surface of said magnetic disc by an amount of about rectangular.

4. A magnetic head loading mechanism for loading a magnetic head as defined in claim 2, wherein said first and second mounting mechanism further comprise a common elevating block formed with inclined surfaces, and rollers, each being provided for said first and second adopters and being in contact with the inclined surfaces of said elevating block in the approaching condition, thereby moving the first and second magnetic heads at the tip of said first and second supporting arms onto the both surfaces of said magnetic disc by the small amount of rotation angle thereof, respectively.

5. A magnetic head loading mechanism for loading a magnetic head as defined in claim 4, wherein said first and second rotating mechanisms and said first and second loading mechanisms, including said rollers, are arranged in symmetry with respect to said elevating block.

6. A magnetic head loading mechanism for loading a magnetic head as defined in claim 1, wherein said first rotating mechanism brings said first supporting arm into the escaping condition by turning said first supporting member away from the surface of said magnetic disc by an amount of about a right angle.

7. A magnetic head loading mechanism for loading a magnetic head as defined in claim 1, wherein said first adopter means further comprises a head holding member for holding the first magnetic head from a bottom side surface of said first supporting arm thereof at a predetermined position with respect to the surface of said magnetic disc.

8. A loading method for loading a magnetic head onto a surface of a magnetic disc to be tested being rotated with high speed, by using a magnetic head loading mechanism as defined in claim 7, comprising following steps of:

holding said first magnetic head attached at a tip of said first supporting arm which is fixed on said first adopter means, by using said holding member, at a predetermined position with respect to the surface of said magnetic disc, from a bottom side surface of said supporting arm;

approaching said first magnetic head onto the surface of said magnetic disc by rotating said first adopter means; and further approaching said first magnetic head onto the surface of said magnetic disc by rotating said first adopter means by a small amount of rotation angle thereof, thereby mounting said first magnetic head upon the surface of said rotating magnetic disc, by floating said first magnetic head and bringing said first supporting arm thereof free from said holding member.

* * * * *